United States Patent
Bethoux

(10) Patent No.: US 11,081,521 B2
(45) Date of Patent: Aug. 3, 2021

(54) PROCESS FOR MANUFACTURING A PLURALITY OF CRYSTALLINE SEMICONDUCTOR ISLANDS HAVING A VARIETY OF LATTICE PARAMETERS

(71) Applicant: Soitec, Bernin (FR)

(72) Inventor: Jean-Marc Bethoux, La Buisse (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/352,085

(22) Filed: Mar. 13, 2019

(65) Prior Publication Data
US 2019/0288030 A1    Sep. 19, 2019

(30) Foreign Application Priority Data

Mar. 13, 2018 (FR) ..................... 1852156

(51) Int. Cl.
*H01L 27/15* (2006.01)
*H01L 33/00* (2010.01)
(Continued)

(52) U.S. Cl.
CPC ........ *H01L 27/156* (2013.01); *H01L 21/0254* (2013.01); *H01L 21/02422* (2013.01);
(Continued)

(58) Field of Classification Search
CPC ......... H01L 2924/00; H01L 2924/0002; H01L 2224/48091; H01L 2924/12044; H01L 27/1292
See application file for complete search history.

(56) References Cited

U.S. PATENT DOCUMENTS 7,981,767 B2 * 7/2011 Guenard ............. H01L 33/0079
438/458
9,478,707 B2    10/2016 Guenard
(Continued)

FOREIGN PATENT DOCUMENTS

CN    101540357 A    9/2009
CN    102214759 A    10/2011
(Continued)

OTHER PUBLICATIONS

Yin et al., Buckling Suppression of SiGe Islands on Compliant Substrates, Journal of Applied Physics, vol. 94, No. 10, (Nov. 15, 2003), pp. 6875-6882.
(Continued)

*Primary Examiner* — Tony Tran
(74) *Attorney, Agent, or Firm* — TraskBritt

(57) ABSTRACT

A method for manufacturing a plurality of crystalline semiconductor islands having different lattice parameters includes providing a relaxation substrate comprising a support and a flow layer on the support that includes first and second groups of blocks having different viscosities at a relaxation temperature. The relaxation substrate also comprises a plurality of strained crystalline semiconductor islands on the flow layer, the islands of a first group being located on the first group of blocks and islands of a second group being located on the second group of blocks. The relaxation substrate is then heat treated at a relaxation temperature higher than or equal to the glass transition temperature of at least one block of the flow layer to cause differentiated lateral expansion of the first and second groups of islands such that the first and second groups of relaxed islands then have different lattice parameters.

12 Claims, 4 Drawing Sheets

(51) Int. Cl.
  *H01L 33/32* (2010.01)
  *H01L 33/06* (2010.01)
  *H01L 33/12* (2010.01)
  *H01L 21/02* (2006.01)
  *H01L 25/075* (2006.01)
  *H01L 33/02* (2010.01)

(52) U.S. Cl.
  CPC .. *H01L 21/02458* (2013.01); *H01L 21/02639* (2013.01); *H01L 25/0753* (2013.01); *H01L 33/007* (2013.01); *H01L 33/0093* (2020.05); *H01L 33/06* (2013.01); *H01L 33/12* (2013.01); *H01L 33/32* (2013.01); *H01L 33/025* (2013.01)

(56) References Cited

U.S. PATENT DOCUMENTS

| | | |
|---|---|---|
| 2002/0136932 A1 | 9/2002 | Yoshida |
| 2009/0045394 A1 | 2/2009 | Smeeton et al. |
| 2010/0087049 A1 | 4/2010 | Kononchuk |

FOREIGN PATENT DOCUMENTS

| | | |
|---|---|---|
| EP | 0786149 A1 | 7/1997 |
| EP | 2151852 A1 | 2/2010 |
| EP | 2151856 A1 | 2/2010 |
| EP | 2865021 B1 | 2/2017 |
| FR | 2936903 B1 | 1/2011 |

OTHER PUBLICATIONS

Liu et al., Monolithic LED Microdisplay on Active Matrix Substrate Using Flip-Chip Technology, IEEE Journal of Selected Topiz in Quantum Electronics, vol. 15, Issue 4, (Jul.-Aug. 2009), pp. 1-5.
Liu et al., 360 PPI Flip-Chip Mounted Active Matrix Addressable Light Emitting Diode on Silicon (LEDoS) Micro-Displays, Journal of Display Technology, vol. 9, No. 8, (Aug. 2013), pp. 678-682.
French Search Report for French Application No. 1852156 dated Nov. 23, 2018, 2 pages.
Durnev et al., Strain Effects on Indium Incorporation and Optical Transitions in Green-Light InGaN Heterostructures of Different Orientations, vol. 208, Issue 11, (Nov. 2011), pp. 2671-2675.
Durney et al., Strain effects on indium?incorporation and optical transitions in green-light InGaN heterostructures of different orientations, Phys. Status Solidi A vol. 208, No. 11, (2011), pp. 2671-2675 (abstract only).
Hiroto et al., Emission color control from blue to red with nanocolumn diameter of InGaN/GaN nanocolumn arrays grown on same substrate, Applied Physics Letters, vol. 96, No. 23, (Jun. 7, 2010), pp. 231104-231104.
Liu et al., 360 PPI Flip-Chip Mounted Active Matrix Addressable Light Emitting Diode on Silicon (LEDoS) Micro-Displays, Journal of Display Technology, Apr. 2013 (abstract only).
Shioda et al., Selective Area Metal-Organic Vapor Phase Epitaxy of Nitride Semiconductors for Multicolor Emission, Ieee Journal of Selected Topics In Quantum Electronics, vol. 15, No. 4, (Jul. 1, 2009), pp. 1053-1065.

* cited by examiner

PROCESS FOR MANUFACTURING A PLURALITY OF CRYSTALLINE SEMICONDUCTOR ISLANDS HAVING A VARIETY OF LATTICE PARAMETERS

PRIORITY CLAIM

This application claims the benefit of the filing date of French Patent Application Serial No. FR1852156, filed Mar. 13, 2018, for "A Method for Manufacturing a Plurality of Crystalline Semiconductor Islands Having a Variety of Lattice Parameters," the entire disclosure of which is incorporated herein in its entirety by this reference.

TECHNICAL FIELD

The present invention concerns a method for manufacturing a plurality of crystalline semiconductor islands having a variety of lattice parameters. This method makes it possible to prepare a growth substrate for the formation, notably, of optoelectronic devices. For example, the disclosure applies to the collective manufacturing of devices having optoelectronic properties that can be different from one another. Particularly, it can be applied in the field of micro-display screens.

BACKGROUND

The documents EP2151852 and EP2151856 disclose a technology intended to form, on a substrate, islands of relaxed or partially relaxed crystalline semiconductor material. These islands can be used for the collective manufacture of light-emitting diodes (LEDs), as explained in detail in document EP2865021, for example.

Multiple products combine LEDs emitting at various wavelengths to form a colored light point. This is among others the case for display screens that enable an image consisting of pixels to be formed, each pixel combining a red, a green, and a blue LED, whose emission can be controlled individually to form a light point of the selected color, by combining light emissions.

The LEDs that are combined to form the pixel are generally not manufactured from the same materials and by using the same technologies. Thereby, blue or green LEDs may consist of nitride (with the general formula InGaN) and red LEDs of phosphide (with the general formula AlGaInP). Manufacturing a screen involves the assembly of the diodes, one by one, to form the pixels of the final device, e.g., using a so-called "Pick and Place" technique.

Since the materials do not have the same properties, the characteristics pertaining to the ageing, thermal/electrical behavior, and/or efficiency of the devices that use them are generally very different. These variabilities must be taken into account when designing a product that includes LEDs consisting of different materials, which may sometimes render the design very complex.

Other solutions provide for forming the pixels from diodes that are all identical, manufactured on the same substrate and/or using the same technology. Monolithic micro-LED panels having a reduced size and a high resolution can then be manufactured. By way of example of such an embodiment, one may refer to the document entitled "360 PPI Flip-Chip Mounted Active Matrix Addressable Light Emitting Diode on Silicon (LEDoS) Micro-Displays," Zhao Jun Liu et al., Journal of Display Technology, April 2013. The light radiation emitted by the micro-panel's LEDs can be chosen in the ultraviolet range and selectively converted, from one diode to another, to various wavelengths in order to correspond to red, green, and blue light emissions so as to form a color screen. This conversion can be achieved by placing a phosphorescent material on the emitting face of the LEDs. However, the conversion consumes light energy, which reduces the quantity of light emitted by each pixel and thus the efficiency of the display device. It also requires dispensing the phosphorescent materials on the emitting surfaces of the LEDs, which renders the manufacturing method of these micro-panels more complex. Moreover, the size of the particles of phosphorescent material may exceed the desired dimension of the light pixels, which does not always allow for this solution to be used.

In order to overcome the limitations discussed above, it would be desirable to be able to simultaneously manufacture, on the same substrate, by using the same technology, LEDs capable of emitting in different wavelengths.

More generally, it would be advantageous to have a growth substrate allowing the collective manufacturing of devices having, for example, optoelectronic properties that are different from one another.

BRIEF SUMMARY

In order to achieve one of these goals, the disclosure provides a method for manufacturing a plurality of crystalline semiconductor islands having a variety of lattice parameters. The method includes the following steps:
  Providing a relaxation substrate having a medium, a flow layer arranged on the medium consisting of a first group of blocks having a first viscosity at the relaxation temperature and a second group of blocks having a second viscosity that is different from the first at the relaxation temperature and, arranged on the flow layer, a plurality of strained crystalline semiconductor islands having an initial lattice parameter, the islands of the first group of islands being arranged on the blocks of the first group of blocks and the islands of the second group of islands being arranged on the blocks of the second group of blocks;
  heat treating the relaxation substrate at the relaxation temperature, greater than or equal to the glass transition temperature of at least one of the blocks of the flow layer, to cause the differentiated lateral expansion of the islands of the first and second group.

Consequently, the lattice parameter of the relaxed islands of the first group and of the relaxed islands of the second group has different values. The differentiated properties of these islands can be used to collectively manufacture devices with different properties, such as optoelectronic properties, different from one another.

According to other advantageous and non-limiting characteristics of the disclosure, taken either separately or in any technically feasible combination:
  the step in which the substrate is provided includes the following:
    the formation on the medium of a first flow layer made of a first material;
    the formation of recesses in the first flow layer;
    the deposition of a second flow layer made of a second material on the first flow layer and in the recesses in view of forming a stack of flow layers;
    the planarization of the stack to eliminate the second layer, except for the recesses, and to form the first group of blocks and the second group of blocks;
  the step in which the substrate is provided includes the following:
} preparing a donor substrate comprising at least one strained crystalline semiconductor layer;

the transfer of the strained layer on the flow layer of the medium;

the execution of trenches in the strained layer to form the islands of the first group of islands on the first blocks and to form the of the second group of on the second blocks of the flow layer;

the execution of trenches in the strained layer is performed after its transfer to the support flow layer;

the relaxation temperature is comprised between 400° C. and 900° C.;

the crystalline semiconductor islands are made of III-N material;

the method includes a step during which the relaxed islands of the first group and the relaxed islands of the second group are transferred to a growth medium;

the transfer step includes carrying over the relaxed islands of the first group and the relaxed islands of the second group to an intermediary medium.

BRIEF DESCRIPTION OF THE DRAWINGS

Further characteristics and advantages of the disclosure will appear from the following detailed description of the disclosure, made in reference to the appended figures, among which.

DETAILED DESCRIPTION

Growth Substrate

Figure 1A:
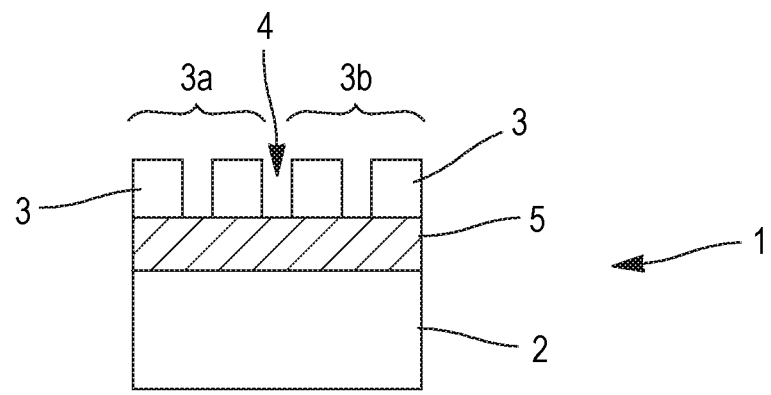
FIGS. 1A and 1B schematically show a cross-section and a top view of a growth substrate according to the disclosure.
Figure 1B:
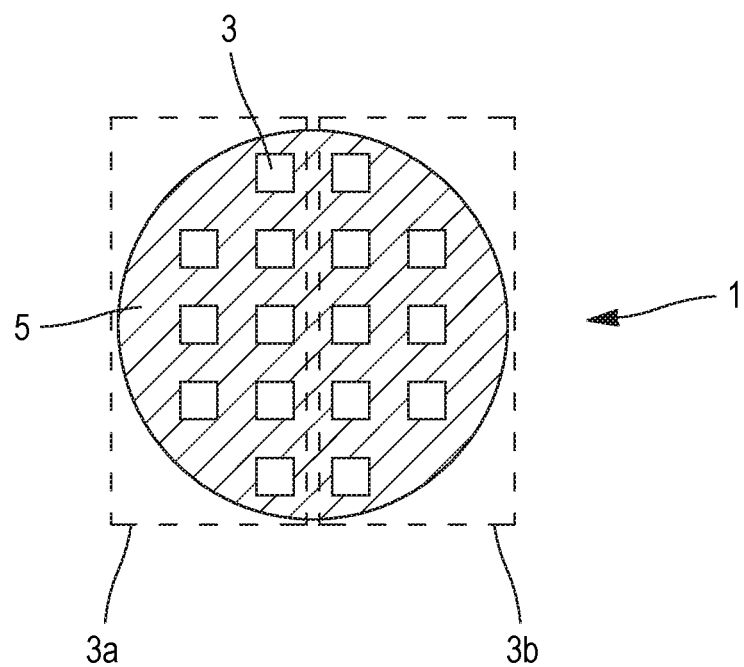

In a first aspect, the present disclosure relates to a growth substrate 1 for the formation of optoelectronic devices. FIGS. 1A and 1B schematically show a cross-section and a top view of such a substrate. The growth substrate 1 is intended to be placed in deposition equipment, such as an epitaxy frame, in order to form active layers of optoelectronic components on the exposed surface of the growth substrate 1. The growth substrate 1 can also serve as mechanical support allowing for devices to be manipulated during further manufacturing steps (formation of electrical contacts, isolation of one device from the other, etc.) leading to the achievement of a functional device.

The growth substrate 1 includes a growth medium 2. This can be a circular wafer of materials, e.g., silicon or sapphire, of standardized dimensions, e.g., 2 inches (50 mm), 4 inches (100 mm) or even 200 mm in diameter. But the disclosure is by no means limited to these dimensions or shapes.

The nature of the growth medium 2 is generally selected so as to be able to withstand treatments (such as depositions, heat treatment, etc.) implemented when manufacturing the actual growth substrate 1 and when manufacturing optoelectronic devices. Preferably, the growth medium 2 has a thermal expansion factor similar or close to that of the materials that will form the useful layer of the optoelectronic device so as to limit the significant strains that could damage these devices following their production.

The growth substrate 1 also comprises a plurality of crystalline semiconductor islands 3 (hereinafter simply referred to as "island(s)"), placed on the growth medium 2. Each island 3 is intended to carry the active layers of an optoelectronic device, such as a LED, a laser or a photovoltaic cell. To this end, the islands 3 can be made of III-N materials. For the formation of nitride-based LEDs, the islands 3 can thus consist of wurtzite structure GaN or InGaN, the axis c of which is perpendicular to the surface, and in which the proportion of indium may vary between 0% and 20% and in particular between 1.5% and 8%.

The term "island" refers to a block of material that is entirely separate from the other islands arranged on the growth medium 2. The term "crystalline" means that the atoms making up an island 3 are assembled in an orderly manner to form a block of monocrystalline material, the block may nevertheless comprise arrangement defects such as dislocation, slip plane or point defect.

The islands 3 are separated from one another by trenches 4. These trenches may have a lateral dimension, separating two islands 3, ranging from 0.1 to 50 microns, or from 1 to 50 microns, and typically in the order of 2 to 20 microns. Each island has a relatively reduced size in relation to the growth substrate, which may, for example, stretch from 1 micron to 1 mm in its largest dimension, depending on the intended final application. The surface of the islands 3 may range from 1 $\mu m^2$ or 4 $\mu m^2$ to 1 $mm^2$, and preferably from 25 $\mu m^2$ to 400 $\mu m^2$. Each island 3 can have any shape, e.g., circular, square, triangular, hexagonal or rectangular, when viewed from above. Its thickness is typically less than 200 nm, in particular when it consists of InGaN. The islands 3 can all be of identical or different shapes and dimensions.

As will be made apparent in the description of the manufacturing method of the growth substrate 1, all islands 3 consist of the same material. However, and according to the disclosure, the islands 3 do not all have the same lattice parameter. Thus, a first group of islands $3a$ has a first lattice parameter and a second group of islands $3b$ has a second lattice parameter that is different from the first.

Since the materials of the islands 3 are identical to each other, the existence of a difference in the lattice parameter indicates the existence of a different strain state between the islands 3 that make up the two groups of islands $3a$ and $3b$.

This characteristic of the growth substrate 1 will be used advantageously to collectively manufacture optoelectronic devices that have distinct light properties, using a single manufacturing technology and on a single growth substrate.

As an example, on the first group of islands $3a$ that has the first lattice parameter, a first LED that directly emits at a first wavelength, e.g., in the green range, and on the second group of islands $3b$ that has the second lattice parameter, a second LED directly emitting at a second wavelength, e.g., in the blue range, may be formed. The terms "directly emitting" are used to indicate that the emission corresponds to the light radiations emitted by an LED's active layers (quantum wells), without needing to use phosphorus conversion.

It may also be provided that the growth substrate 1 comprises at least one third group of islands, this third group of islands having a third lattice parameter that is different from the first and the second. More generally, the growth substrate may comprise any number of island groups, each group being formed by islands having a lattice parameter that is different from that of the islands belonging to the other groups. In this way, it will be possible to obtain a growth substrate 1 allowing the formation of LEDs emitting in the range of red, green, blue, and infra-red wavelengths on the same substrate using a single technology.

The distribution and arrangement of the groups of islands 3a, 3b on the surface of the growth medium 2 is not an essential characteristic of this aspect of the disclosure, and all possible distributions and arrangements may be considered. They may sometimes be dictated by the application under consideration.

A first example of distribution and arrangement of the first and second groups of islands 3a, 3b on the surface of the medium 2 has thus been represented on FIGS. 1A and 1B. In this example, the first group of islands 3a occupies a first area of the growth medium 2 and the second group of islands 3b a second area of the growth medium 2, which are separate from one another and adjacent to each other.

One can advantageously choose to place the islands 3, 3', 3" of a first, second, and third group of islands next to each other, which would allow the respective formation of LEDs emitting in different colors, e.g., red, green, and blue, respectively. This arrangement has been represented schematically in FIG. 2A. Such a combination of LEDs constitutes a light emitting pixel P whose emission color can be controlled. The islands 3, 3', 3" that will carry the LEDs constituting these pixels P can be arranged in a regular manner on the surface of the growth medium 2. Monolithic pixels P may thus be formed, i.e., placed on the same substrate and handleable as a pixel, e.g., by a component insertion device, in order to be included in a functional device.

Figure 2A:
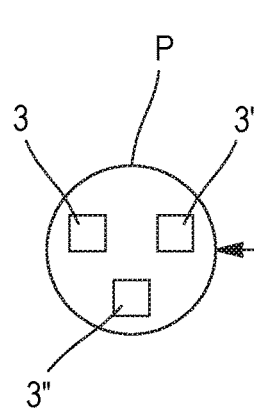
FIGS. 2A, 2B, and 2C show an example of how the crystalline semiconductor islands can be arranged and distributed on the surface of a growth medium.
Figure 2B:
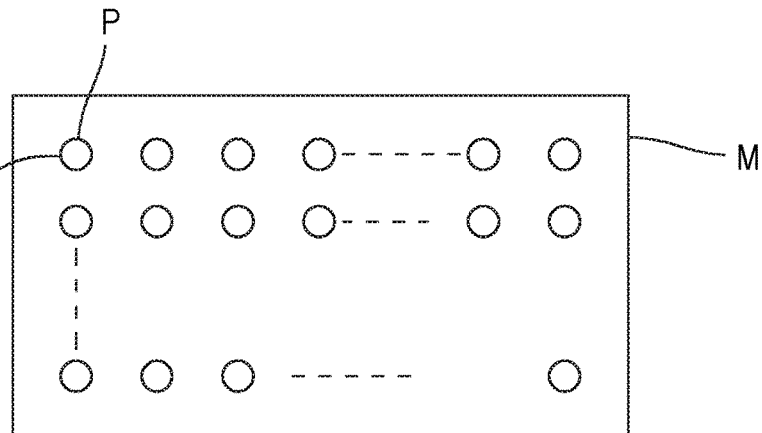
Figure 2C:
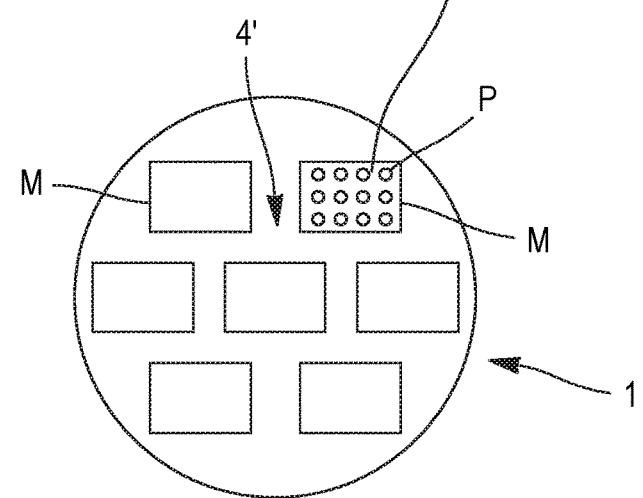

In the case where the formation of a monolithic micro-panel of LEDs is desired, e.g., for a color micro-display screen, the pixels P could, for example, be distributed evenly according to lines and rows to form a matrix M, as represented in FIG. 2B. And a growth substrate 1 may comprise a plurality of such matrices M, as represented in FIG. 2C.

Returning to the description of FIGS. 1A and 1B, and in addition to the growth medium 2 and the crystalline semiconductor islands 3, the growth substrate 1 also comprises at least one assembly layer 5 arranged between the growth medium 2 and the islands 3. Herein, the assembly layer is directly in contact with the growth medium and with the islands 3, but the growth substrate could comprise other intermediary layers. This assembly layer 5 may include a layer of silicon oxide or silicon nitride, or consist of a stack of such layers designed to, for example, facilitate subsequent removal of the growth medium.

Method for Manufacturing a Growth Substrate

Figure 3A:
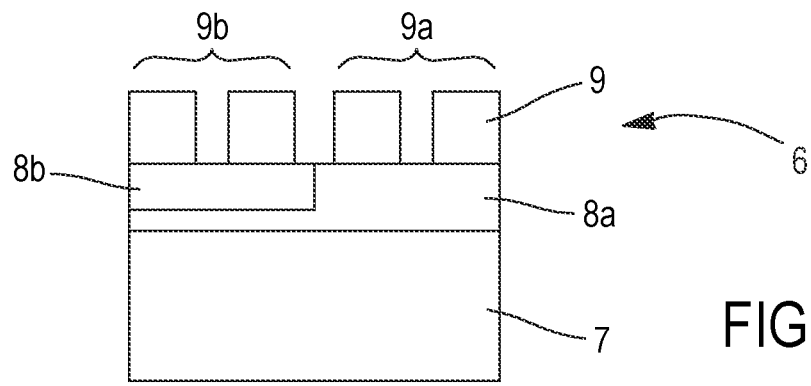
FIGS. 3A to 3C show a method for manufacturing a growth substrate according to the disclosure.
Figure 3B:
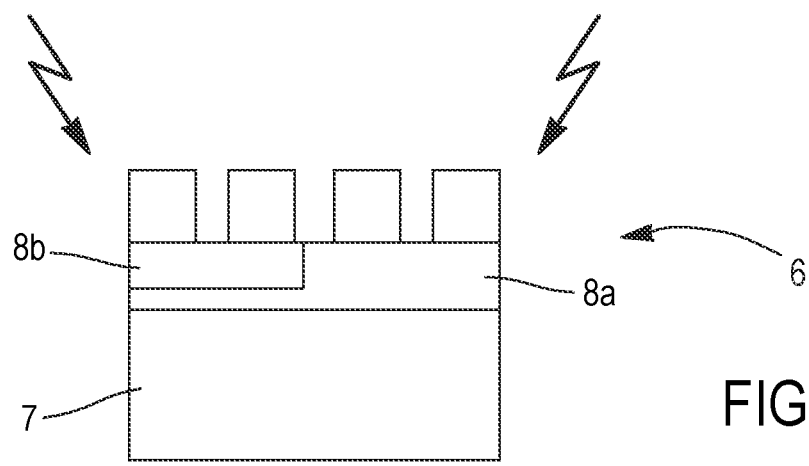
Figure 3C:
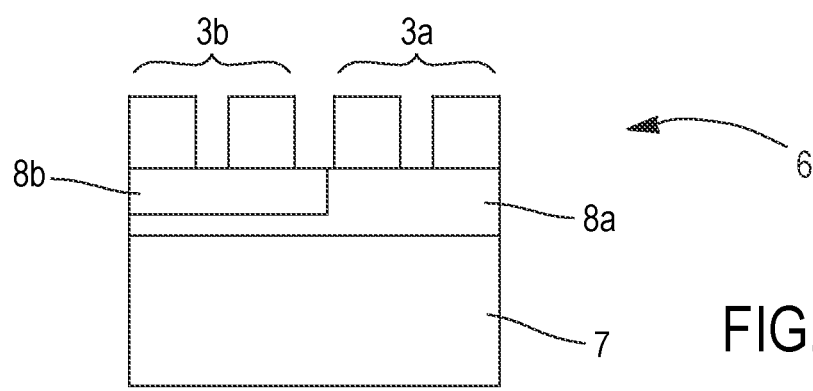

With reference to FIGS. 3A to 3C, an example of a method for manufacturing a growth substrate according to the disclosure is now disclosed.

The method implements the principles of the crystalline semiconductor island transfer and relaxation technology, such as they are described in documents EP2151852, EP2151856 or FR2936903.

As a reminder, according to an exemplary embodiment according to this method, a strained crystalline semiconductor layer is first formed on a donor substrate. This layer is then transferred to a substrate comprising a flow layer by bonding and by thinning and/or fracturing the donor substrate. The islands are then defined in the transferred layer, and a heat treatment is subsequently applied to the substrate and the islands at a temperature that is higher than the viscosity transition temperature of the flow layer, which leads to at least partial relaxation of the islands. The degree of relaxation achieved following the relaxation heat treatment can reach 70 to 80% or 95% of the maximum degree of relaxation corresponding to the obtaining of a perfectly relaxed layer. This degree of relaxation depends on the thickness and nature of the islands as well as on the duration and extent of the heat treatment.

To assist this relaxation and prevent any island warpage phenomenon during the plastic deformation that takes place during relaxation, a stiffening layer may be provided on or under the islands prior to applying the relaxation heat treatment. As explained in detail in the document titled "Buckling suppression of SiGe islands on compliant substrates," Yin et al. (2003), Journal of Applied Physics, 94(10), 6875-6882, the degree of relaxation of an island achieved after this heat treatment step is that which balances the strains in the stiffening layer and in the island. It should be noted that the stiffening layer can be formed from (or include) a residue of the donor substrate that would have been preserved on the strained layer following the transfer thereof onto the flow layer. It may have been placed on the exposed face of the donor substrate to end up under the island after the transfer of the strained layer and the formation of the islands.

The present disclosure takes advantage of the relaxation phenomenon to provide a method for manufacturing a plurality of crystalline semiconductor islands having a variety of lattice parameters.

As shown in FIG. 3A, the manufacturing method according to the disclosure includes the supply of a relaxation substrate 6 comprising a relaxation medium 7, a flow layer 8 arranged on the relaxation medium 7 and, arranged on the flow layer 8, a plurality of strained crystalline semiconductor islands 9. Initially, the strained islands 9 all have the same lattice parameter. One can refer to the cited documents regarding the state of the art to choose the nature of the relaxation medium 7 and of the flow layer 8.

According to the disclosure, and with reference to FIG. 3A, the flow layer 8 consists of a first group of blocks 8a and of a second group of blocks 8b. Herein, each group of blocks 8a, 8b consists of a single block for the sake of simplifying the description, but in general terms, a group of blocks may consist of one or of a plurality of blocks. The term "block" must be understood in a very broad sense, referring to a block or combination of blocks of homogeneous material, this block defining any volume, which is not necessarily convex.

The blocks of the first group 8a and the blocks of the second group 8b are composed of different materials, which, for a given temperature, respectively have a first and second viscosity that are different from one another. The strained islands 9 arranged on the blocks 8a of the first group form a first group of strained islands 9a and, similarly, the strained islands 9 arranged on the blocks 8b of the second group form a second group of strained islands 9b.

The viscosity of the blocks 8a of the first group being different from the viscosity of the blocks 8b of the second group, the strained islands 9 are likely to relax, at least partially, in a differentiated manner. In other terms, the strained islands of the first group 9a have a relaxation potential that is different from the relaxation potential of the strained islands 9b of the second group. Insofar as the strained islands 9 are all of the same dimensions, the strain energy they contain is generally similar, but the nature of the block on which they rest being different, the islands 9 are likely to relax in a differentiated manner.

The strained islands 9 may come from a donor substrate and may have been transferred to the flow layer 8 of the relaxation substrate 6 using the bonding and thinning steps briefly mentioned above. As an example, the donor substrate may consist of a sapphire base medium, a GaN buffer layer formed on the base substrate, and an InGaN strained layer with a proportion of indium ranging from 1 to 20% on the GaN buffer layer. Traditional photolithography, resin depositing, and etching steps may have been used to define the strained InGaN islands 9 from the continuous InGaN layer. These steps may have been applied before or after the transfer steps. As mentioned above, the islands 9 may carry a stiffening layer that is a residue of the donor substrate. This could be the GaN layer, from 10 to 100 nm thick, that initially formed the buffer layer of the donor substrate. In an alternative embodiment not represented, the stiffening layer can be formed under the constrained islands 9, or under some of them. The stiffening layer can be formed on the exposed surface of the donor substrate. It may be locally etched so as to selectively form islands with or without this underlying layer or with a variable thickness of this stiffening layer. The islands that have an underlying stiffening layer will have a lower lateral expansion potential than the islands without stiffening layer, for an identical flow layer.

Figure 4A:
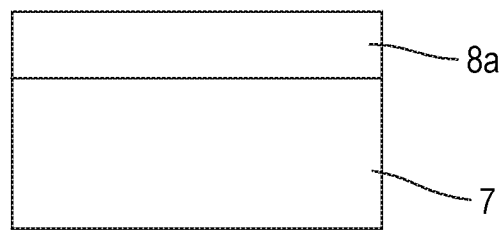
FIGS. 4A to 4D show a method for manufacturing a flow layer according to the disclosure.
Figure 4B:
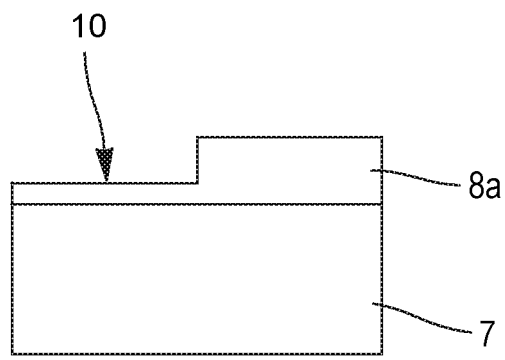
Figure 4C:
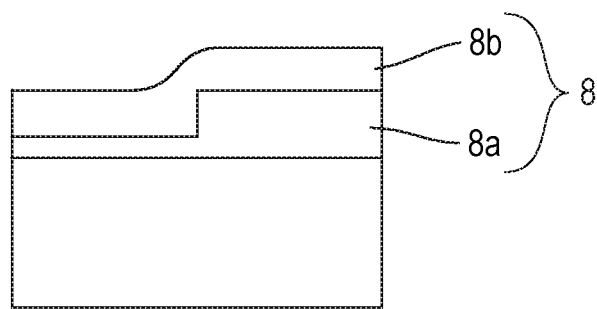

FIGS. 4A to 4D show a sequence of possible steps to produce a flow layer 8 consisting of blocks 8a, 8b of different viscosities. With reference to FIG. 4A, a first flow layer 8a is formed on the relaxation medium 7. This may be a dielectric layer of silicon dioxide or of silicon nitride comprising a determined proportion of boron and/or of phosphorus in order to give it a first viscosity value. In the following step, shown in FIG. 4B, at least one recess 10 is provided through partial masking and etching of the first flow layer 8a. The recess 10 may be partial, as shown in the figure, or correspond to the entire thickness of the first flow layer 8a. In a subsequent step, the remaining first flow layer 8a and the recess 10 are coated with a second flow layer 8b. This second flow layer 8b preferably has a sufficient thickness to fill the entire recess 10. The material making up the second flow layer 8b is of a different nature than that of the first flow layer 8a so that the first and second flow layers have a different viscosity when they are exposed to a determined relaxation temperature.

This different viscosity may either be higher or lower than that of the first flow layer 8a. For example, if the first flow layer is made of silicon dioxide or silicon nitride, which has a particularly high viscosity, the material chosen for the second flow layer 8b may be BPSG, with a sufficient boron and phosphorus weight percentage, for example, higher than 4%, to have a lower viscosity than that of the first layer.

Figure 4D:
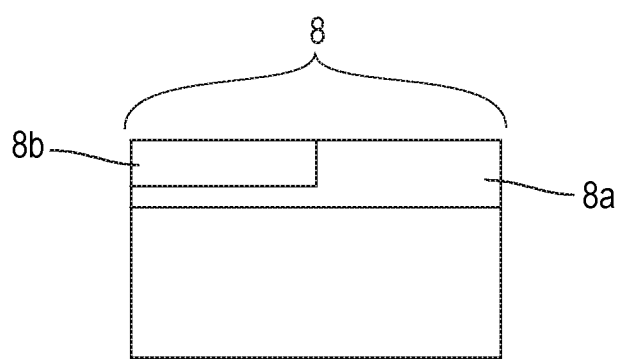

With reference to FIG. 4D, the exposed surface of the substrate is then planarized to eliminate the second flow layer except for the recesses 10 until the flow layer 8 is exposed. The first blocks 8a and the second blocks 8b making up the flow layer 8 are thus formed. It should be noted that the flow layer 8 thus produced has a particularly planar surface, which makes it favorable for receiving the strained islands 9 by means of a layer transfer.

Returning to the manufacturing method and in a subsequent step of this method shown in FIG. 3B, the relaxation substrate 6 is heat treated at a relaxation temperature that is higher than or equal to the glass transition temperature of the flow layer of at least one of the blocks of the flow layer 8 to cause the differentiated relaxation of the islands 9a, 9b of the first and second groups. According to the nature of the blocks making up this layer, the heat treatment may include exposing the relaxation substrate 6 to a relaxation temperature between 400° C. and 900° C. for a period ranging from a few minutes to several hours. In this way, lateral expansion of the strained islands 9 of the first and second groups of islands 9a, 9b is caused, forming at least partially relaxed islands 3, shown in FIG. 3C.

In other terms, since the strained islands of the first group 9a and the strained islands of the second group 9b rest on blocks having different viscosities at the relaxation heat treatment temperature and thus having a different lateral expansion potential, the heat treatment leads to relaxing, to varying degrees, the initially strained islands 9 of the first and second groups 9a, 9b and to causing their differentiated lateral expansion. Therefore, following the relaxation heat treatment, the lattice parameter of the islands 3 of the first group of islands 3a is different from the lattice parameter of the islands 3 of the second group of islands 3b. "Lateral expansion potential" refers to the lateral expansion or contraction to which an island 9 must be subject to, to reduce its elastic strain energy and balance it with the elastic strain of the flow layer with which it is in contact.

The degree of relaxation obtained during and after the relaxation heat treatment depends, among other things, on the size of an island 9, and the nature of the block 8a, 8b on which it rests, and more particularly on the viscosity of the material of which it is made.

In order to achieve the right level of relaxation and the target lattice parameter for each of the groups of islands 3a, 3b, the relaxation heat treatment step may be repeated.

Also, the thickness of the island or that of a possible stiffening layer of the first group and/or of the second group of islands 3a, 3b, or of any other group of islands, can be modified prior to applying an additional relaxation heat treatment step. In this way, the lattice parameters of the islands 3 arranged on the relaxation substrate 6 may be refined by repeating the application of a relaxation heat treatment. As mentioned above, the formation of more than two groups of islands 3a, 3b may of course be considered.

After the manufacturing method described above, one can choose to transfer the relaxed islands 3 to another medium. This transfer may include carrying these islands over to an intermediary medium prior to transferring them to this other medium. For example, one can choose to transfer the islands 3 to a growth medium 2, possibly via an assembly layer 5, which would then allow having a growth substrate 1 such as has been described above and shown in FIG. 1A. A growth substrate that does not contain any flow layer is thus obtained, since the flow layer may be incompatible with the steps required to manufacture the active layers of the optoelectronic devices. Moreover, in the case where these islands are composed of a polar material, this transfer allows the initial polarity of this material, such as it had been formed on the donor substrate, to be retrieved from the exposed face of the growth medium 2.

Method for Manufacturing a Plurality of Optoelectronic Devices

The method just presented can be used to collectively manufacture a plurality of optoelectronic devices. These devices each comprise active layers that may be different from one device to another. The devices then have optoelectronic properties that differ from one another. The terms "collective manufacturing" are used to mean that the manufacture of these devices uses a single technology applied to a single substrate to form the active layers.

This method includes supplying a growth substrate 1 according to the general description provided above. Therefore, it comprises at least a first group of crystalline semiconductor islands 3a having a first lattice parameter and a second group of crystalline semiconductor islands 3b having a second lattice parameter that is different from the first.

The following step is aimed at forming the active layers by growth on the exposed face of these islands 3. As is well-known per se, to achieve this, the growth substrate is placed in a deposition chamber, e.g., that of an epitaxy frame. During deposition, streams of precursor gases flow through this chamber, these gases comprising the atomic elements that compose the active layers to be deposited on the islands 3. The precursor gases are heated above the growth substrate 1 so as to free the atomic elements and to enable their adsorption on the surface of the growth substrate 1 and, in particular, on the surface of the islands 3. According to the nature, the relative concentration, and the period during which these precursor gases circulate, the nature and the thickness of these layers, which are progressively formed on the crystalline semiconductor islands 3, can be controlled. If this is necessary, type p or n doping agents may be introduced in the chamber to form doped layers. In particular, the precursor gases can be controlled to form active layers of electronic devices, such as quantum wells or LED heterostructures, on the islands.

By way of example, an active layer of LEDs may include the following layer stack on an island 3 composed of InGaN having an In concentration ranging from 1% to 20%, and at least partially relaxed (typically in the order of 90%):

- an n-doped InGaN layer having an In concentration similar to that of the island 3;
- a multiple quantum well comprising a plurality of layers, each layer comprising a distinct proportion of indium, having a difference of a few percentage points in relation to that of the underlying n-doped layer. The quantum well is capable of emitting a light radiation of a wavelength selected according to the nature of the layers that it consists of;
- a p-doped InGaN layer having an In concentration ranging from 0 to 10%. To simplify its manufacturing, it can also be provided that the p-doped layer be formed from GaN.

The precursor gases used to form these active layers of LEDs can include trimethylgallium (TMGa), triethylgallium (TEGa), trimethylindium (TMIn), and ammonia ($NH_3$).

The incorporation of certain atomic elements of the precursor gases in the deposited layer is affected by the lattice parameter of this layer. This is particularly the case concerning the incorporation of indium in an InGaN layer, as has been reported in the document titled "Strain effects on indium incorporation and optical transitions in green-light InGaN heterostructures of different orientations," by M. V Durnev et al., Phys. Status Solidi A 208, No. 11, 2671-2675 (2011). It appears that the solubility of indium in a material increases as the lattice parameter of this material increases. In other terms, all other things being equal, the incorporation of indium in a material during its formation by deposition increases with the lattice parameter of the material into which it is incorporated.

The present disclosure takes advantage of this observation to form the growth substrate 1 of the active layers of a plurality of optoelectronic devices, these active layers possibly being different from one device to another. The method generally implements a step in which the growth substrate 1 is exposed to an atmosphere comprising at least one initial concentration of an atomic element.

On the islands 3 of the first group of islands 3a of the growth substrate 1, which has a first lattice parameter, the atomic element is incorporated in the active layer in a first concentration. On the islands 3 of the second group of islands 3b, which has a second lattice parameter that is different from the first, the atomic element is incorporated in the active layer at a second concentration that is different from the first. If the second lattice parameter is greater than the first, the second concentration will be greater than the first.

In other terms, the first and second concentrations are determined by the initial concentration of the atomic species in the chamber and by the first and the second lattice parameters of the islands. As is well-known in the field of material growth, other parameters may also influence the nature of the layers that are formed, as, for example, the pressure of the chamber, the temperature, the respective flow of the precursor gases, etc.

By providing a growth substrate for which the first and the second lattice parameter have been adequately selected, it is possible to form active layers having different optoelectronic properties. By way of example, the proportion of indium incorporated in the InGaN active layers deposited on the islands of the first group of islands may lead to the formation of LEDs directly emitting a radiation within the blue range. At the same time, the proportion of indium incorporated in the InGaN active layers deposited on the islands of the second group of islands can lead to the formation of LEDs directly emitting a radiation within the green range.

Once the active layers have been formed on the islands, the method of manufacturing electronic devices may be continued, in particular to form the electrical contacts and to isolate the devices from one another, as is described in document U.S. Pat. No. 9,478,707, for example. The islands 3 coated with their active layers may also be carried over to a LED support and the growth medium 2 eliminated.

Application to the Manufacturing of a Monolithic Micro-Panel of LEDs and to a Micro-Display Screen A specific application of the growth substrate and of the collective manufacturing method described above aims to manufacture a monolithic micro-panel of LEDs.

As a reminder, such a micro-panel consists in an arrangement of LEDs, generally all identical and of very small size, arranged into rows and columns at a constant pitch on a panel support. When the LEDs have been manufactured collectively, the micro-panel is said to be "monolithic." This characteristic is advantageous, since the LEDs then have very similar properties (such as the current and/or voltage behavior, changes with ageing, etc.), which facilitates the design and the manufacturing of the micro-panel. Within the scope of the present disclosure, a micro-panel in which all the LEDs have been manufactured collectively and extracted collectively from the same manufacturing medium to form the micro-panel will be designated as a monolithic micro-panel; or a micro-panel consisting of monolithic pixels, i.e., each pixel consists of LEDs manufactured collectively and extracted collectively from the same manufacturing medium. In this case, the monolithic pixels are assembled together so as to form the micro-panel.

The monolithic micro-panel of LEDs can be assembled with a pilot circuit using a "flip-chip" technology, which allows performing the electrical connection of each LED of the micro-panel with a driving circuit of the control circuit. This assembly may consist in assembling an entire monolithic micro-panel with a control circuit, each LED of the micro-panel being associated with a driving circuit after assembly. Or the assembly may consist in successively assembling one or a plurality of monolithic pixels to the pilot circuit to associate them with the control circuit. Regardless of the chosen approach, a monolithic micro-display screen is formed in this way.

Since the LEDs all have identical or similar electrical properties, the driving circuits of the control circuit may also have identical or similar electrical properties, which considerably facilitate the manufacturing of the micro-display screen.

A detailed discussion of this device and its manufacturing method can be found in "Monolithic LED Microdisplay on Active Matrix Substrate Using Flip-Chip Technology," Liu et al., IEEE Journal of Selected Topics in Quantum Electronics (Volume: 15, Issue: 4, July-August 2009)

It should be noted that known monolithic micro-panels all consist of LEDs directly emitting a single wavelength, thus enabling monochrome display. Color display is achieved via the phosphorus conversion placed on the emitting face of some of these LEDs, or by optically combining a plurality of micro-panels each emitting a radiation chosen in a combination of complementary colors, e.g., red, green and blue. These techniques are not advantageous for obvious reasons of complexity of implementation, of efficiency, and of density, as has been reminded in the introduction to the present application.

On the contrary, the methods and substrates according to the present disclosure can be used to provide a monolithic micro-panel of LEDs comprising a panel support and a plurality of LEDs arranged on this panel. The plurality of LEDs includes a first group of LEDs capable of directly emitting a light radiation having a first wavelength and a second group of LEDs capable of directly emitting a second light radiation having a second wavelength that is different from the first.

A micro-panel according to the disclosure is thus capable of emitting different colors without needing to optically combine a plurality of micro-panels or to apply conversion means. For applications in the field of color displays, the micro-panel comprises at least three groups of LEDs, each group emitting a wavelength that is different from that of the others. There can, for example, be a first group of LEDs directly emitting in the red, a second group of LEDs directly emitting a radiation in the green, and a third group of LEDs directly emitting a radiation in the blue ranges. Having a fourth group of LEDs directly emitting in the infra-red range can also be considered, this illumination being used to provide additional features to the device in which the micro-panel is integrated (tactile function, eye iris recognition, motion sensing, etc.).

For applications in the field of color displays, the LEDs of each group are arranged evenly on the panel support, e.g., spaced at a constant pitch along rows and columns in order to form a display matrix. They are also arranged to place side by side, or more precisely in close proximity to each other, a LED of each group so as to form a bright pixel, whose color can be controlled, in each location of the matrix. The size of the LEDs may vary according to the group in order to play on the distribution of the luminous intensities of the various emission colors. For example, red LEDs may be larger than blue and green LEDs.

The micro-panel may consist of LEDs that can be used to form a matrix of large-sized pixels, e.g., of 50 pixels by 50 pixels, or of 200 pixels by 200 pixels, or even more.

Even though the bright pixels of the panel consist of LEDs emitting in different wavelengths, these LEDs have been formed collectively using a single technology and on a single substrate. They thus have properties and, more specifically, electrical and ageing properties that are very similar to each other, which enables association of the LEDs with a control circuit comprising driving circuits that are all identical or very similar.

An example of how to prepare a micro-panel and/or micro-display screen implementing the method for manufacturing islands having a variety of lattice parameters is described hereunder.

First, a growth substrate 1, comprising a growth medium 2 provided with an assembly layer 5 consisting of a 500 nm stack of silicon oxide in contact with the sapphire medium, 200 nm of silicon nitride and one micron of silicon dioxide, is prepared. This stack is designed to enable the detachment of the growth medium through laser irradiation in a subsequent step of the method. This growth medium may, for example, consist of a sapphire wafer 150 mm in diameter. The growth substrate is composed of three groups of InGaN islands containing 18% of indium. The islands all have a thickness of 40 nm and a 10 micron square shape. The first group of islands has a lattice parameter of 0.3184 nanometers, the second group has a lattice parameter of 0.3218 nanometers, and the third group has a lattice parameter of 0.3248 nanometers. These target lattice parameters have been chosen so that the collective manufacturing step of the active layers of LEDs leads to the formation of LEDs emitting radiations in the blue, green, and red ranges.

The islands 3 that make up each of these groups are distributed and arranged on the growth medium 2 according to a matrix arrangement similar to that detailed in relation with the description of FIGS. 2A to 2C. Three islands 3, 3', and 3" of each of the groups are thus arranged in close proximity to each other so as to define a pixel; and these groupings of islands distributed according to a matrix along rows and lines on the surface of the growth substrate 1. Panel trenches 4' that are larger than the trenches 4 separating two islands may be provided to separate the matrices from one another, each matrix delimiting a set of islands 3, 3', 3" intended to carry the LEDs of a micro-panel.

To manufacture this growth substrate 1, a relaxation substrate 6 comprising a relaxation medium 7, e.g., made of sapphire also of 150 mm, and to form a flow layer 8 on it, are first prepared.

The preparation of the flow layer includes first of all the formation of a stripping layer consisting of a stack of 500 nm of silicon oxide in contact with the sapphire medium and of 200 nm of silicon nitride. This stripping stack is designed to enable the detachment of the relaxation medium 7 by laser irradiation in a subsequent step of the method. A first layer of one micron of silicon dioxide is then formed on the stripping layer. Recesses arranged on the surface of the medium are formed in the first layer by lithographic masking and etching to make them correspond to the islands of the second group and bringing the thickness of the first layer of silicon dioxide down to 100 nm. A second layer of about one micron in thickness is then deposited on the surface of the substrate, on the first layer and in the recesses, this second layer consisting of silicon dioxide and a weight percentage of 3% boron and 4% phosphorus. The photolithographic masking and etching steps are repeated to form new recesses that are this time arranged on the surface of the substrate to make them correspond to the islands of the third group. Etching is carried out to remove the entire thickness of the second BPSG layer and to preserve a thickness of 100 nm of the first silicon dioxide layer. A third layer consisting of silicon dioxide and a weight percentage of 4% boron and 4% phosphorus is then deposited. Lastly, the surface is planarized to partly eliminate the third and second layers so as to form the first, second and third groups of blocks making up the flow layer 8.

The relaxation substrate also includes strained InGaN islands 9, 10 microns square, containing 18% of indium carried over to the flow layer 8 according to a layer transfer method explained in detail in the general description of the present disclosure and by making trenches 4. These strained islands 9 are arranged in a similar manner as has been described above for the relaxed islands 3 of the growth substrate 1. The lattice parameter of these strained islands 9 is of 0.3184 nanometers. Each strained island 9 rests on a block of one of the first, second and third groups thus defining a first, second and third group of strained islands.

The strained islands 9 are coated with an initial GaN stiffening layer 50 nm thick, a residue of a GaN buffer layer of a donor substrate used to realize the relaxation substrate.

A relaxation heat treatment is performed, for example, at 750° C. for one hour. This treatment leads to the lateral expansion of the initially strained islands 9 to form the partially relaxed islands 3. At the relaxation temperature of 750° C., the viscosity of the blocks of the third group is estimated to be about $1E10\ N \cdot m^{-2} \cdot s^{-1}$, that of the blocks of the second group is estimated to be about $4E10\ N \cdot m^{-2} \cdot s^{-1}$, and that of the blocks of the first group, made of silicon dioxide, is not viscous, i.e., they have a viscosity greater than $1E12\ N \cdot m^{-2} \cdot s^{-1}$. Accordingly, following the relaxation heat treatment at 750° C., the relaxation rate of the strains in the islands of the third group is of 90%, they thus have a lattice parameter of 3.248 Å. The relaxation rate of the strains in the islands of the second group is of about 50%, i.e., a lattice parameter of 3.218 Å. The lattice parameter of the islands of the first group has not changed and remains at 3.184 Å.

The estimated viscosity values are only given as examples. For blocks of different compositions or for a different relaxation temperature, the heat treatment time may be adjusted in order for the relaxation rate of the island arranged on the block of intermediate viscosity to range between 40% and 60% at the outcome of the process and for the relaxation rate of an island arranged on a block of lower viscosity to be greater than 70%.

The GaN stiffening layer that coats the partially relaxed islands is then eliminated only by etching and the relaxation heat treatment is renewed under the same conditions as those previously described. Following this treatment, the lattice parameters of the islands of the first, second and third groups are respectively of about 3.184 Å, 3.218 Å and 3.248 Å, i.e., within 0.005 Å.

The partially relaxed InGaN islands 3 are then carried over by bonding on a growth medium 2 provided with an assembly layer 5, e.g., a multilayer of silicon dioxide and nitride.

It is then placed in a chamber of an epitaxy frame, in which a set of precursor gases (TMGa, TEGa, TMIn, and $NH_3$) is circulated in order to make active layers of nitride-based LEDs grow on each of the islands.

The lattice parameters of the islands of the first group, of the second group, and of the third group of islands being different from each other, the incorporation of indium in the active layers of InGaN that form on the islands of these groups is also different. On the islands of the first group, LEDs directly emitting radiation in the blue range are obtained, on the islands of the second group LEDs directly emitting radiation in the green range, and on the islands of the third group LEDs directly emitting radiation in the red range are formed.

Following this deposition step, on the growth substrate 1, active layers of LEDs are thus arranged at the level of a pixel and emitting colors in the red, green, and blue ranges.

The manufacturing of a functional LED on the growth substrate can be completed, among others, by forming the LED contacts on either side of the active layers.

If at this stage, monolithic micro-panels are desired, the wafer on which rest the LEDs that have just been formed can be cut along the trenches 4' defining the pixel matrices. Each of these matrices then constitutes a micro-panel.

Alternatively, the wafer comprising the micro-panels may also be assembled with a second wafer on which control circuits, consisting of a matrix of driving circuits, have been formed. Each matrix is arranged on the surface of this wafer according to the same arrangement as the LEDs on the growth substrate. The assembly enables contacting electrically each diode with a driving circuit. A plurality of display screens is constituted in a single contacting step. It can then be decided that the growth medium 2 can be eliminated, e.g., by laser irradiation, as well as the assembly layer, e.g., by chemical etching, so as to expose a light emission surface of the LEDs. These surfaces can be prepared using optical surface treatment or protection elements in order to improve the quality and the robustness of the screen. The wafer can be cut out in a conventional manner so as to isolate the screens from each other in view of packaging them.

Of course, the disclosure is not limited to the described embodiments and alternative solutions can be used without departing from the scope of the disclosure, as defined in the claims.

For example, the differentiated properties of the islands can be used to create devices other than the LEDs or displays that have been used as examples. These may include lasers or photovoltaic devices.

The invention claimed is:

1. A method for manufacturing a plurality of crystalline semiconductor islands having a variety of lattice parameters, the method comprising the following steps:
   providing a relaxation substrate comprising a medium, a flow layer on the medium and comprising a first group of blocks having a first viscosity at a relaxation temperature and at the same time a second group of blocks having a second viscosity that is different from the first group of blocks at the relaxation temperature and, a plurality of strained crystalline semiconductor islands having an initial lattice parameter on the flow layer, islands of a first group of islands being located on the blocks of the first group of blocks and islands of a second group of islands being located on the blocks of the second group of blocks; and
   heat treating the relaxation substrate at a relaxation temperature that is higher than or equal to a glass transition temperature of at least one block of the flow layer to cause differentiated lateral expansion of the islands of the first and second groups, the lattice parameter of a first group of relaxed islands and the lattice parameter of a second group of relaxed islands then having different values.

2. The method of claim 1, wherein the step of providing the relaxation substrate comprises:
   forming a first flow layer made of a first material on the medium;
   forming recesses in the first flow layer;
   depositing a second flow layer made of a second material on the first flow layer and in the recesses to form a stack of flow layers; and
   planarizing the stack of flow layers to eliminate the second flow layer, except for in the recesses, and to form the first group of blocks and the second group of blocks.

3. The method of claim 2, wherein the step of providing the relaxation substrate further comprises:
   providing a donor substrate comprising at least one strained crystalline semiconductor layer;
   transferring the at least one strained crystalline semiconductor layer to the flow layer on the medium; and
   forming trenches in the at least one strained crystalline semiconductor layer to form the islands of the first group of islands on the first group of blocks and to form the islands of the second group of islands on the second group of blocks of the flow layer.

4. The method of claim 3, wherein forming the trenches is performed after the transferring of the at least one strained crystalline semiconductor layer to the flow layer on the medium.

5. The method of claim 4, wherein the relaxation temperature is between 400° C. and 900° C.

6. The method of claim 5, wherein the crystalline semiconductor islands comprise III-N material.

7. The method of claim 6, further comprising a transfer step including transferring of relaxed islands of the first group and relaxed islands of the second group to a growth medium.

8. The method of claim 7, wherein the transfer step further comprises temporarily transferring the relaxed islands of the first group and the relaxed islands of the second group to an intermediary medium prior to transferring the relaxed islands of the first group and the relaxed islands of the second group to the growth medium.

9. The method of claim 1, wherein the relaxation temperature is between 400° C. and 900° C.

10. The method of claim 1, wherein the crystalline semiconductor islands comprise III-N material.

11. The method of claim 1, further comprising a transfer step including transferring of relaxed islands of the first group and relaxed islands of the second group to a growth medium.

12. The method of claim 11, wherein the transfer step further comprises temporarily transferring the relaxed islands of the first group and the relaxed islands of the second group to an intermediary medium prior to transferring the relaxed islands of the first group and the relaxed islands of the second group to the growth medium.

* * * * *